(12) United States Patent
Huang et al.

(10) Patent No.: US 10,096,980 B2
(45) Date of Patent: Oct. 9, 2018

(54) ELECTRIC VEHICLE FOR ROUTING INSPECTION OF POWER TRANSMISSION LINES

(71) Applicants: State Grid Corporation of China, Beijing (CN); Wuxi Electric Power Company of Jiangsu Electric Power Corporation, Jiangsu (CN)

(72) Inventors: Liping Huang, Jiangsu (CN); Xu Weng, Jiangsu (CN); Haiping Shen, Jiangsu (CN); Wenjun Jiang, Jiangsu (CN); Ting Liu, Jiangsu (CN); Kai Liu, Jiangsu (CN); Pan Tang, Jiangsu (CN); Hongjun Chen, Jiangsu (CN)

(73) Assignees: State Grid Corporation of China, Beijing (CN); Wuxi Electric Power Company of Jiangsu Electric Power Corporation, Jiangsu (CN)

( * ) Notice: Subject to any disclaimer, the term of this patent is extended or adjusted under 35 U.S.C. 154(b) by 222 days.

(21) Appl. No.: 14/969,922

(22) Filed: Dec. 15, 2015

(65) Prior Publication Data
US 2017/0117690 A1     Apr. 27, 2017

(30) Foreign Application Priority Data
Oct. 23, 2015 (CN) .......................... 2015 1 0698206

(51) Int. Cl.
| | |
|---|---|
| *H02G 1/02* | (2006.01) |
| *B61B 3/02* | (2006.01) |
| *B61B 12/02* | (2006.01) |
| *B61F 13/00* | (2006.01) |
| *G01R 31/08* | (2006.01) |

(52) U.S. Cl.
CPC .................. *H02G 1/02* (2013.01); *B61B 3/02* (2013.01); *B61B 12/02* (2013.01); *B61F 13/00* (2013.01); *G01R 31/085* (2013.01)

(58) Field of Classification Search
CPC .. H02G 1/00; H02G 1/02; H02G 1/16; H02G 7/00; H02G 7/02; H02G 7/05; B61B 3/00; B61B 10/02; B61B 12/002; B61C 13/02; B61C 13/04; B61C 13/06
See application file for complete search history.

(56) References Cited

U.S. PATENT DOCUMENTS

| | | | | |
|---|---|---|---|---|
| 8,302,537 | B2 * | 11/2012 | Quattlebaum | A63G 21/22 104/112 |
| 8,578,858 | B2 * | 11/2013 | Drogo | B61B 12/028 104/112 |

* cited by examiner

*Primary Examiner* — Robert J McCarry, Jr.

(57) ABSTRACT

An electric vehicle for routing inspection of power transmission lines, includes a body; a running mechanism mounted to the body, comprising a front wheel and a rear wheel connected by a cross beam and rolling on the cable; an obstacle sensor and a cam rotatably mounted to the cross beam, the cam rotating to roll onto the cable after an obstacle is detected on the cable such that the front wheel is raised to a position above the cable, and the cam continuing rolling on the cable after the front wheel passes the obstacle such that the front portion of the cross beam falls back downwards and the front wheel then falls back onto the cable, a hanging seat rotatably hanging to the body and a control device at least partially disposed in the hanging seat and comprising a braking device.

8 Claims, 4 Drawing Sheets

ELECTRIC VEHICLE FOR ROUTING INSPECTION OF POWER TRANSMISSION LINES

TECHNICAL FIELD

The present invention relates to the electric power technology, and specifically to an electric vehicle for routing inspection of power transmission lines.

BACKGROUND OF THE INVENTION

In the high-voltage power transmission lines, the cable is one of the important components for power transmission. With time passing, the damaged conditions, such as surface corrosion or cracking, may occur to the cable, and it is necessary to make inspection and maintenance in time. During some maintenance operations, in order to shorten the power failure time and improve the amount and reliability of power supply, the live working along the power lines is needed, such as replacing spacers or repairing cables. Currently, the live working along the power lines mainly depends on running operators in an equi-potential state for routing inspection and maintenance of power transmission lines. However, there are some problems to be solved.

1) As the cables of the power lines are in a relatively high position and have a long span, it is strenuous for the operator to make maintenance during running, especially when climbing. During routing inspection and maintenance of power transmission lines, the operators are high in labor intensity and low in working efficiency.

2) As the running and operating along the power transmission lines are performed manually and the mobility is low, the tools carried by the operators are limited, both in type and amount. Therefore, some special problems, if presented, can not be solved in time.

3) With the working way by the running operators in an equi-potential state, the running and the operating are less stable, more difficult and highly risky.

SUMMARY OF THE INVENTION

Therefore, in the present invention, an electric vehicle for routing inspection of power transmission lines is provided, enabling safer and more effective routing inspection and maintenance for power transmission lines.

According to an embodiment of the invention, an electric vehicle for routing inspection of power transmission lines is provided, used for routing inspection along multiple divided cables of high-voltage power transmission lines, comprising:

a body;

a running mechanism mounted to the body, comprising a front wheel and a rear wheel connected by a cross beam and rolling on the cable, the front and rear wheels each having an annular groove on its circumferential rim for receiving the cable therein; an obstacle sensor directing forward with respect to the front wheel; and a cam rotatably mounted to the cross beam, the cam rotating to roll onto the cable after an obstacle is detected on the cable within an effective range in front of the front wheel by the obstacle sensor, to support a front portion of the cross beam upwards such that the front wheel is raised to a position above the cable, and the cam continuing rolling on the cable after the front wheel passes the obstacle such that the front portion of the cross beam falls back downwards and the front wheel then falls back onto the cable, wherein two of the running mechanisms are running on two parallel cables, respectively;

a hanging seat rotatably hanging to the body, below the running mechanisms; and a control device at least partially disposed in the hanging seat and comprising a braking device, the braking device having a braking block able to detachably press against a lower surface of the cable and/or the front wheel and/or the rear wheel.

Preferably, in any of the embodiments of the present invention, each of the two running mechanisms is mounted to the body by a respective hanging arm; and each hanging arm has a lower end mounted to the body and an upper end above the cable for mounting the running mechanism, at least one of the hanging arms is movable, with its lower end rotatably mounted to the body such that the two hanging arms can rotate with respect to each other to be in a close state or an open state, wherein in the close state, the front and rear wheels of the two running mechanisms are mounted and positioned on the cables.

Preferably, in any of the embodiments of the present invention, the upper end of one of the hanging arms bends towards the other hanging arm and then bends back downwards to form an "n" shaped structure for enclosing the front wheel or rear wheel, wherein the "n" shaped structure has an opening which is opened downwards; and the hanging arm is provided with a closing structure at the opening of the "n" shaped structure for at least partially closing the opening.

Preferably, in any of the embodiments of the present invention, at least one of the two hanging arms has a telescopic portion in the direction of the length such that the upper end of the hanging arm has an adjustable elevation.

Preferably, in any of the embodiments of the present invention, the braking device comprises:

a braking lever comprising a pivot connection rotatably mounted to the body, as well as an inner end and an outer end positioned at opposite sides of the pivot connection;

a braking block mounted on the inner end of the braking lever and positioned below a portion of the cable where the front wheel or rear wheel is positioned;

a manipulating member connected to the outer end of the braking lever;

a spring connected between the braking lever and the body, with a connection point of the spring to the braking lever being apart from the pivot connection of the braking lever;

wherein when the manipulating member is activated, the outer end of the braking lever is rotated downwards and the braking block on the inner end of the braking lever is driven to move upwards to press against the lower surface of the cable for braking operation; and wherein when the manipulating member is deactivated, the braking lever is rotated in an opposite direction due to a restoring force of the spring such that the braking block is detached from the cable.

Preferably, in any of the embodiments of the present invention, the braking block has a braking face for pressing against the lower surface of the cable and the braking face has a recessed shape corresponding to the contour of the cable; or the braking block has a braking face for pressing against the lower surface of the cable and the braking face has a groove extending along the extension direction of the cable.

Preferably, in any of the embodiments of the present invention, the obstacle sensor comprises a tactile sensor or an optical sensor.

Preferably, in any of the embodiments of the present invention, the tactile sensor comprises a telescopic probe directing forward with respect to the front wheel and the probe can retract when contacting an obstacle in front of it.

Preferably, in any of the embodiments of the present invention, the cam is provided on its circumferential rim with a plurality of mini-wheels whose rotation axes are parallel to a rotation axis of the cam, and each mini-wheel is radially recessed on its circumferential rim.

Preferably, in any of the embodiments of the present invention, the multiple divided cables are four divided cables, or three divided cables, or two divided cables.

Therefore, the electric vehicle for routing inspection of power transmission lines according to the embodiment(s) of the present invention enables safer and more effective routing inspection and maintenance for power transmission lines.

DESCRIPTION OF THE DRAWINGS

The description will be set forth hereinafter with reference to the accompanying drawings, provided only by way of non-limiting example, in which.

DESCRIPTION OF EXEMPLARY EMBODIMENTS

Figure 1:
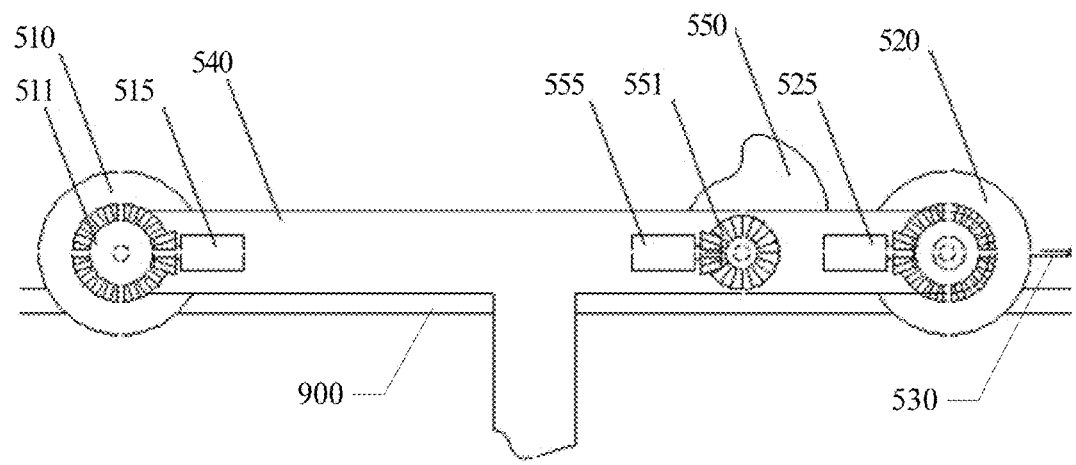
FIG. 1 is a structural diagram of a running mechanism of an electric vehicle for routing inspection of power transmission lines according to an embodiment of the present invention, wherein a normal running state is shown.

Hereinafter, to make the objective(s), technical solution(s) and advantages of the present invention clearer and better understood, the present invention will be further described in detail, in connection with specific embodiments and with reference to the accompanying drawings.

According to an embodiment of the invention, an electric vehicle for routing inspection of power transmission lines is provided, enabling safer and more effective routing inspection and maintenance for power transmission lines.

According to an embodiment of the invention, an electric vehicle for routing inspection of power transmission lines is provided, used for routing inspection along multiple divided cables of high-voltage power transmission lines, comprising:

a vehicle body (or referred as "body" for brevity);

a running mechanism mounted to the body, comprising a front wheel and a rear wheel connected by a cross beam and rolling on the cable, the front and rear wheels each having an annular groove on its circumferential rim for receiving the cable therein; an obstacle sensor directing forward with respect to the front wheel; and a cam rotatably mounted to the cross beam, the cam rotating to roll onto the cable after an obstacle is detected on the cable within an effective range in front of the front wheel by the obstacle sensor, to support a front portion of the cross beam upwards such that the front wheel is raised to a position above the cable, and the cam continuing rolling on the cable after the front wheel passes the obstacle such that the front portion of the cross beam falls back downwards and the front wheel then falls back onto the cable, wherein two of the running mechanisms are running on two parallel cables, respectively;

a hanging seat rotatably hanging to the body, below the running mechanisms; and a control device at least partially disposed in the hanging seat and comprising a braking device, the braking device having a braking block able to detachably press against a lower surface of the cable and/or the front wheel and/or the rear wheel.

With such solution, the electric vehicle for routing inspection of power transmission lines (referred as "electric vehicle" hereinafter for brevity) is enabled to run along the cable(s) by the front and rear wheels rolling on the cable(s). The cable is restricted within the annular groove on the circumferential rims of the front and rear wheels, to avoid or reduce the risk of separating and falling of the front and rear wheels from the cable. The hanging seat is rotatably hanging to the body and positioned below the running mechanisms such that the hanging seat can maintain a state of hanging down vertically, and the operator(s) in the hanging seat can use the control device to control the actions of the electric vehicle, such as running forward, braking, etc.

It should be noted that the running mechanism has a function of crossing obstacles by the obstacle sensor and the cam provided therein. Specifically, when the electric vehicle is normally running on the cable, the cam maintains stationary and above the cable, without any contact with the cable; however, when an obstacle is detected on the cable within an effective range in front of the front wheel by the obstacle sensor, the cam can rotate accordingly. In one embodiment, the cam may start rotating immediately; and in another embodiment, the cam may start rotating after a further period of time, for example, the cam may start rotating only when a distance of the obstacle in front (to the obstacle sensor or to the front wheel) is further detected to be less than a predetermined threshold. Then, with the shape changing in the cam circumferential rim (or curving contour) during rotation of the cam, the cam comes into contact, by its circumferential rim, with the upper surface of the cable and thus begins to roll on the cable. As the cam having a special circumferential rim curve continues rolling on the cable, the distance between a cam-cable contact point of the cam in contact with the cable and the cam rotation shaft (which may be driven by the respective motor to rotate, thus rotating the cam) becomes larger, thus the cam, rotatably mounted on the cross beam and rolling on the cable, starts supporting a front portion of the cross beam upwards such that the front wheel mounted to the front portion of the cross beam is raised off the cable to a position above the cable by a height or distance and even higher with the rolling of the cam on the cable, to help the front wheel to cross the obstacle. Preferably, in an embodiment, the front wheel may be raised to a position higher than the obstacle to ensure a successful crossing. In an embodiment, for example, when the cam rotates by 180 degrees, the front wheel may reach its highest position to facilitate its obstacle crossing. After the front wheel crosses the obstacle, the cam in an embodiment may continue rolling on the cable (while in another embodiment, the cam may start rotating in an opposite direction to retract off the cable), the further shape changing in the cam circumferential rim may cause the distance between the cam-cable contact point and the cam rotation shaft becomes smaller such that the front portion of the cross beam falls back downwards and the front wheel then falls back onto the cable. As the cam continues rotating, it is then detached from the cable and finally goes back to its initial position in the retraction state. In an embodiment, the cam may rotate a complete revolution of 360 degrees from its starting rotation to its stopping rotation. After the front wheel crossed the obstacle, the rear wheel may subsequently pass the same obstacle with dragging by the front wheel. Therefore, with the rotation of the cam, the front wheel can be raised up. The resistance for obstacle cross and the risk of separating and falling from the cable are decreased. Thus, the running mechanism and the electric vehicle comprising the same can easily cross the obstacles, such as the spacers, the straight line suspension strings, and the shockproof hammers, etc.

It should be noted that with the help of the rotatable cam, the front wheel (or the rear wheel in some embodiment) can be raised off the cable to a position above the cable by a height or distance, thus facilitating obstacle crossing of the front wheel (or the rear wheel in some embodiment). It should be understood that in an embodiment, the front wheel (or the rear wheel in some embodiment) may be raised to a position higher than the obstacle to be crossed to ensure a successful crossing. In another embodiment, however, in consideration of safety, the front wheel (or the rear wheel in some embodiment) may be raised to a position not higher than (or in some embodiments even lower than) the obstacle to be crossed to ensure a successful crossing. In this case, it is still easier for the front wheel (or the rear wheel in some embodiment) to cross the obstacle with the help of the cam, compared with the prior art without the obstacle crossing structure (such as the cam of the present invention, for example). Such embodiments also fall within the scope of the present invention.

Therefore, the electric vehicle for routing inspection of power transmission lines is electrically driven and is operated conveniently for running by the operator(s) in the hanging seat. For example, an on-board electric power source is available in an embodiment and optionally the electric power source may be disposed in the hanging seat. The electric vehicle has a strong driving power, enabling a faster running speed and a higher operation efficiency and allowing more routing inspection and maintenance tools to be carried. Moreover, the electric vehicle has a flexible ability of obstacle crossing. Therefore, the electric vehicle for routing inspection of power transmission lines according to the embodiment(s) of the present invention enables safer and more effective routing inspection and maintenance for power transmission lines (such as high-voltage or high-current power transmission lines).

It should be noted that the terms of "front" and "rear" as used herein are provided based on the direction of running forward of the electric vehicle. That is, the "front" (or "forward") corresponds to the direction of running forward of the electric vehicle, and the "rear" corresponds to a direction opposite to the direction of running forward of the electric vehicle.

It should be noted that when two of the running mechanisms are running on two parallel cables, respectively, the "two parallel cables" may be two cables having substantially same elevations (or heights) or two cables having different elevations (or heights), as further described in detail hereinafter.

In a preferred embodiment, optionally, the circumferential rim of the cam is radially recessed, forming a recessed annular structure along the circumferential rim of the cam, to at least partially adapt in shape to the convex circular contour of the cable. Therefore, when rolling on the cable by its circumferential rim, the cam can better "grasp" or "hold" the cable under it by its recessed circumferential rim, thus reducing or avoid the risk of separating and falling of the cam from the cable.

Preferably, in any of the embodiments of the present invention, the cam is provided on its circumferential rim with a plurality of mini-wheels whose rotation axes are parallel to a rotation axis of the cam. Thus, when the cam is rolling on the cable by its circumferential rim, these mini-wheels roll on the cable accordingly such that the friction resistance can be reduced when the cam is rolling on the cable. More preferably, the mini-wheel is radially recessed on its circumferential rim to at least partially adapt in shape to the convex circular contour of the cable. Therefore, when rolling on the cable by its circumferential rim, the cam can better "grasp" the cable under it by the recessed circumferential rims of the mini-wheels, thus reducing or avoid the risk of separating and falling of the cam from the cable.

In an embodiment, optionally, the circumferential rim of the mini-wheel may be flush with the circumferential rim of cam body of the cam. In another embodiment, the circumferential rim of the mini-wheel may be recessed or lower with respect to the circumferential rim of cam body of the cam. Therefore, the cam can "embrace" and "grasp" the cable under it with a larger contact area, thus better reducing or avoid the risk of separating and falling of the cam from the cable.

In an embodiment, optionally, the running mechanism may comprises a plurality of cams, such as a front cam for the front wheel and a rear cam for the rear wheel, to help the front and rear wheels cross the obstacles, respectively. In this case, the running mechanism can either cross a front obstacle by the front wheel when running forward or cross a rear obstacle by the rear wheel when running backward, thereby significantly improving the mobility and adaptability of the running mechanism and thus the electric vehicle.

In another embodiment, optionally, the running mechanism may comprise only one cam. The single cam is disposed in an appropriate position between the front and rear wheels, which cam may be positioned closer to the front wheel than the rear wheel, to help only the front wheel to cross the obstacle(s) in front (or the front obstacle).

Preferably, in any of the embodiments of the present invention, each of the two running mechanisms is mounted to the body by a respective hanging arm; and each hanging arm has a lower end mounted to the body and an upper end above the cable for mounting the running mechanism, at least one of the hanging arms is movable, with its lower end rotatably mounted (by a hinge, for example) to the body such that the two hanging arms can rotate with respect to each other to be in a close state or an open state, wherein in the close state, the front and rear wheels of the two running mechanisms are mounted and positioned on the cables.

Therefore, when the electric vehicle is to be mounted to the cable(s) (such as two parallel cables), the two hanging arms open with respect to each other (in this case, their lower ends mounted to the body are maintained at their original positions, while their free upper ends are opened or spaced with respect to each other forming a region with an opening angle therebetween) such that the two respective cables are positioned within the region between the two hanging arms. Then, the two hanging arms close with respect to each other (in this case, the opening angle therebetween is decreased, and preferably the opening angle between the lower portions of the two hanging arms may be decreased to zero, i.e. the lower portions of the two hanging arms are parallel to each other) such that the cables are enclosed in an inner side space surrounded by and between the two hanging arms, and preferably the two hanging arms may be locked with each other by the locking means and thus be held in position in the close state. In the close state, the wheels of the two running mechanisms, mounted at the free upper ends of the hanging arms, respectively, can be mounted in position on the two parallel cables, respectively. It should be noted that the hanging arm is not formed with a straight line shape, but is extended following a predetermined path or curve such that there is a distance between the two hanging arms in the close state at least in the middle portions thereof, thus forming the inner side space surrounded by the two hanging arms in the close state. With such inventive design, it is convenient to place the electric vehicle onto the cables or remove it from the cables. The two hanging arms held or locked together in the close state ensures that the wheels (i.e. the front wheel and/or the rear wheel) are running on the cables within the inner side space surrounded by the two hanging arms in the close state, thus the running of the electric vehicle on the cables can be more stable and more reliable, thereby enabling safer and more effective routing inspection and maintenance for power transmission lines.

In an embodiment, optionally, a locking means is releasably connected between the two hanging arms and can lock the two hanging arms with respect to each other when they are in the close state.

It should be noted that the "upper end" and "lower end" of the hanging arm as used herein are not limited to a mathematical or geometrical concept, such an upper end point and a lower end point; instead, they refer to a practical concept, i.e. a portion located at the upper end or the lower end and having a certain size or occupying a certain region. Therefore, in practical use, the "upper end" and "lower end" may have a structure with more specific details. For example, the lower end may have a hinge structure connected with the body, or the upper end (or the free upper end) may have a mounting structure for mounting the wheel(s) of the electric vehicle, as further described in detail hereinafter.

In an embodiment, optionally, one of the two hanging arms is fixedly or permanently connected to the body and thus may be referred as "fixed hanging arm", while the other hanging arm is rotatably connected (by a hinge, for example) to the body and thus may be referred as "movable hanging arm". Therefore, only one hanging arm (i.e. the movable hanging arm) can be rotated to change the relative state between the two hanging arms, i.e. the close state or the open state (for example, a state where the two hanging arms form an angle therebetween).

In another embodiment, optionally, the two hanging arms are both rotatably connected (by a hinge, for example) to the body, respectively. That is, the two hanging arm are both movable and each of them can be rotated to change the relative state between the two hanging arms, i.e. the close state or the open state (for example, a state where the two hanging arms form an angle therebetween).

In an embodiment, optionally, the two hanging arms are symmetrically disposed with respect to a middle plane between the two parallel cables.

In an embodiment, optionally, the two running mechanisms are mounted to the body by a hanging mechanism comprising the two hanging arms. Optionally, one of the hanging arms is fixedly connected to the body and the other hanging arm is rotatably connected (by a hinge, for example) to the body. In an embodiment, the two hanging arms may have their lower portions, which are connected to the body, respectively, extending in a vertical direction and opposing to each other. More preferably, the locking means may comprise a screw rod passing through the lower portions of the two hanging arms and a handwheel connected to an end of the screw rod, wherein the handwheel is disposed on a side of the fixed hanging arm which is fixedly connected to the body.

Therefore, the screw rod can be moved by rotation of the handwheel, thus enabling adjustment of the relative positions (or angles) between the two hanging arms as desired.

In an embodiment, optionally, the two hanging arms may have connection holes. When the two hanging arms are closed (i.e. in the close state), their connection holes are aligned with each other. The screw rod can pass through the aligned connection holes of the two hanging arms (more preferably also passing through a connection hole of the body where the hanging seat is hanged), and may be screwed by a nut (preferably a pair of nuts, for example).

In an embodiment, optionally, the hanging mechanism may comprise a lock. When the two hanging arms are closed, they can be locked together by the lock to prevent them from accidentally opening due to the influence of vibration or other external forces.

Preferably, in any of the embodiments of the present invention, the upper end of one of the hanging arms bends towards the other hanging arm and then bends back downwards to form an "n" shaped structure for enclosing the front wheel or rear wheel, wherein the "n" shaped structure has an opening which is opened downwards; and the hanging arm is provided with a closing structure at the opening of the "n" shaped structure for at least partially closing the opening.

Therefore, when the electric vehicle is running along the cable by its wheels (the front and rear wheels, for example) rolling on the cable, the wheel and the respective segment of the cable are enclosed and restricted within the inner space as defined by the "n" shaped structure, thus reducing the risk of separating and falling of the front and rear wheels from the cable. The lower opening of the "n" shaped structure may be used for the wheel to move into or out of the inner space as defined by the "n" shaped structure when the electric vehicle is to be mounted to or removed from the cable(s).

The closing structure can enclose or restrict the wheel of the electric vehicle as well as the respective segment of the cable within the inner space as defined by the "n" shaped structure in a better and more reliable way, thus reducing the risk of separating and falling of the front and rear wheels from the cable. It should be understood that the closing structure is a movable structure which can be selectively close or open the opening of the "n" shaped structure before or after mounting the electric vehicle to cable as required.

In an embodiment, optionally, the closing structure may comprise a spring leaf (optionally disposed obliquely). The spring leaf has its first end fixed to a first inner side wall forming the lower opening of the "n" shaped structure, and extends (optionally obliquely extends upwards or downwards) from this first end towards a second inner side wall forming the lower opening of the "n" shaped structure and opposing the first inner side wall. The second end of the spring leaf opposite to the first end thereof resiliently presses against the second inner side wall to close the lower opening.

Therefore, when the electric vehicle is to be mounted to the cable(s), the spring leaf may be deflected to expose the lower opening of the "n" shaped structure such that the wheel (the front wheel or the rear wheel) of the running mechanism can enter the inner space of the "n" shaped structure through the lower opening and be disposed in an appropriate position. In an embodiment, preferably, the spring leaf may be deflected towards the inner space of the "n" shaped structure to expose the lower opening of the "n" shaped structure; while in another embodiment, optionally, the spring leaf may be deflected outwards away from the inner space of the "n" shaped structure to expose the lower opening of the "n" shaped structure. After the wheel enters the inner space of the "n" shaped structure, the spring leaf can move, due to the resilient restoring force of the spring leaf, back to its original position to resiliently press against the second inner wall forming the lower opening, thus closing the lower opening again to prevent the wheels from separating and falling from the cable or prevent the cable from sliding out of annular grooves on the circumferential rims of the front and rear wheels.

Preferably, in any of the embodiments of the present invention, at least one of the two hanging arms has a telescopic portion in the direction of the length such that the upper end of the hanging arm has an adjustable elevation.

In the practical applications, sometimes the two parallel cables in the multiple divided cables (such as four divided cables) are not always extended with the equal elevation (or height), instead, there may be a difference in elevation (or height) between the two parallel cables in some segments of the cables. In this case, especially when the difference in elevation is relatively large, the electric vehicle running on the cables may incline or even fall out of the cables. To ensure stable running of the electric vehicle, it is necessary to adjust the elevation (or height) of at least one of the running mechanisms (especially the wheels mounted at the upper ends of the hanging arms) such that the two running mechanisms running on the two parallel cables with a notable (not negligible) difference in elevation (or height) therebetween can both run stably. With the telescopic design for the hanging arm, the free upper end of at least one hanging arm has an adjustable elevation (or height) and thus the elevation (or height) of the running mechanism (especially the front and rear wheels thereof) mounted to the free upper end of the hanging arm is adjustable accordingly, thereby ensuring that the running mechanisms can maintain an appropriate posture and thus can run stably on the two parallel cables.

In an embodiment, optionally, the telescopic portion of the hanging arm may be connected to a screw bar of a lifting device. The rotation of the screw bar causes the telescopic portion to be lengthened or shortened such that the free upper end of the hanging arm and the running mechanism mounted thereto can be raised or lowered accordingly.

In an embodiment, optionally, the electric vehicle may further comprise a limiting structure disposed at the outside of the lower end of the movable hanging arm (i.e. being out of the "inner side space" between the two hanging arms, as further described hereinafter). It should be noted that the limiting structure may be disposed on the vehicle body or on the hanging arm. When the movable hanging arm opens outwards from the close state to the open state, the limiting structure can prevent the movable hanging arm from further opening with respect to the other hanging arm.

It should be noted that the "outside" or "outwards" herein is used referring to the "inner side space" surrounded by the two hanging arms in the close state. That is, the side of the hanging arm towards the "inner side space" between the two hanging arms is the "inside" or "inner side", while the opposite side thereof is the "outside" or "outer side". For example, in an embodiment, each of the two hanging arms is provided with a respective limiting structure, and thus the two hanging arms may be positioned between these two limiting structures.

Therefore, when one of the hanging arms rotates outwards to open away from the other hanging arm, the rotating hanging arm will not open excessively to make the operation out of control.

In an embodiment, optionally, the limiting structure is connected to the body, or is a portion extended from the body. Therefore, when the movable hanging arm opens outwards from the close state to the open state, the limiting structure can support against the movable hanging arm to prevent the movable hanging arm from further opening with respect to the other hanging arm.

In another embodiment, optionally, the limiting structure may be disposed on the hanging arm, rather than the body.

Preferably, in any of the embodiments of the present invention, the obstacle sensor comprises a tactile sensor or an optical sensor.

Preferably, in any of the embodiments of the present invention, the tactile sensor comprises a telescopic probe directing forward with respect to the front wheel and the probe can fold upwards when contacting an obstacle in front of it. Therefore, the tactile sensor will not influence the running mechanism to cross the obstacle.

In another embodiment, the tactile sensor may comprise a foldable probe directing forward with respect to the front wheel and the probe can retract when contacting an obstacle in front of it. Therefore, the tactile sensor will not influence the running mechanism to cross the obstacle.

In an embodiment, optionally, the running mechanism may further comprise a rear obstacle sensor directing backward with respect to the rear wheel. With respect to the front obstacle sensor (i.e. the "obstacle sensor directing forward with respect to the front wheel") as described above, the rear obstacle sensor itself may have the same or similar inner structure and connections with other components. Therefore, when the running mechanism is running in an opposite direction (i.e. running backwards), the rear obstacle sensor can be used to detect any possible obstacle(s) on the cable along the running path, with the same/similar function as that of the front obstacle sensor. Thus, the related description for the rear obstacle sensor may refer to the detailed explanation for the front obstacle sensor, and will not be described repeatedly herein.

In an embodiment, optionally, the braking device may comprise: a manipulating member (such as a manipulating lever for example) disposed in the hanging seat. When the manipulating member is activated, the braking block below the lower surface of the cable is driven to move upwards to press against the lower surface of the cable for braking operation.

In this case, the front wheel or rear wheel running on the cable presses on the cable from above while the braking block below the cable presses on the cable from below, thereby sandwiching the cable between the front/rear wheel and the braking block and thus enabling a better braking operation with a higher friction force between the cable and the wheel or the braking block. Such braking by means of increased friction force will not act directly on the wheels to cause a risk of the wheel separating and falling out of the cable, thus enabling a more stable and safer braking.

In an embodiment, optionally, the manipulating lever may be replaced by a braking pulling handle connected by a steel wire. The braking pulling handle in an embodiment may be disposed in the hanging seat to facilitate operation by the operator(s).

In an embodiment, optionally, the manipulating lever of the braking device may comprise a manual lever and/or a pedal plate or lever.

In an embodiment, optionally, the braking block may be disposed below only the rear wheel (not for the front wheel) such that the cable is positioned between the rear wheel and the braking block, for a safer braking operation.

In another embodiment, optionally, a rear braking block may be disposed below the rear wheel (such that the cable is positioned between the rear wheel and the rear braking block) and a front braking block may be disposed below the front wheel (such that the cable is positioned between the front wheel and the front braking block).

In an embodiment, optionally, a first portion of the braking lever where the braking block is provided (i.e. the portion of the braking lever from the point for mounting the braking block to the point to be rotatably mounted to the body, or the pivot connection as described hereinafter) is heavier than (or, in an aspect of size, larger or longer than) a second portion of the braking lever where the manipulating lever is connected. Therefore, the first portion of the braking lever can normally maintain inclined downwards due to the gravity effect such that the braking block can maintain detached from the cable above it. When the manipulating lever is activated, the second portion of the braking lever is pulled downwards while the first portion of the braking lever is inclined upwards accordingly, thus driving the braking block to move upwards to press against the lower surface of the cable for braking.

In an embodiment, optionally, a spring may be disposed between a manipulating end of the braking lever for connection to the manipulating lever and the body or the respective hanging arm. The spring maintains a tension state to pull the manipulating end of the braking lever upwards such that the braking block at the other side of the braking lever can maintain detached from the cable above it. When the manipulating lever is activated to pull the manipulating end of the braking lever downwards against the spring force, the portion of the braking lever where the braking block is provided will incline upwards accordingly (similar to the action of leverage effect), thus driving the braking block to move upwards to press against the lower surface of the cable for braking.

Preferably, in any of the embodiments of the present invention, the braking device comprises:

a braking lever comprising a pivot connection rotatably mounted to the body, as well as an inner end and an outer end positioned at opposite sides of the pivot connection;

a braking block mounted on the inner end of the braking lever and positioned below a portion of the cable where the front wheel or rear wheel is positioned;

a manipulating member connected to the outer end of the braking lever;

a spring connected between the braking lever and the body, with a connection point of the spring to the braking lever being apart from the pivot connection of the braking lever;

wherein when the manipulating member is activated, the outer end of the braking lever is rotated downwards and the braking block on the inner end of the braking lever is driven to move upwards to press against the lower surface of the cable for braking operation; and wherein when the manipulating member is deactivated, the braking lever is rotated in an opposite direction due to a restoring force of the spring such that the braking block is detached from the cable.

In this case, the electric vehicle comprising the braking device can run along the cable(s) by the front and rear wheels rolling on the cable(s) and the operator(s) in the hanging seat below the cables can perform the braking operation to the electric vehicle by controlling to the manipulating member of the braking device. The cable is restricted within the annular groove on the circumferential rim of the front/rear wheel to prevent the front/rear wheel from separating and falling from the cable. Also, the cable is positioned between the wheel (i.e. the front wheel or the rear wheel) above it and the braking block below it, wherein the braking block is aligned with the front wheel or the rear wheel. In this case, the front wheel or rear wheel running on the cable (above the cable) presses on the cable from above while the braking block below the cable presses on the cable from below when the manipulating member is activated, thereby sandwiching the cable between the front/rear wheel and the braking block and thus holding the cable therebetween. This enables a better braking operation with a higher friction force between the cable and the wheel or the braking block. Such braking by means of increased friction force will not act directly on the wheels to cause a risk of the wheel separating and falling out of the cable, thus enabling a more stable and safer braking.

In an embodiment, optionally, the spring may be connected to an upper surface of the outer end of the braking lever and will be in a tension state after the outer end of the braking lever rotates downwards.

Therefore, the spring can enable the outer end of the braking lever connected thereto to normally maintain inclined upwards with respect to the pivot connection of the braking lever, and thus enable the inner end of the braking lever to maintain inclined downwards (or even drooping substantially vertically in an embodiment), thereby ensuring that the braking block maintains detached from the lower surface of the cable above it. When the braking operation is to be performed, the manipulating member may be activated to pull and rotate the outer end of the braking lever downwards, and the spring in the tension state produces a tensile force to resist such change of the braking lever. When the force applied to the manipulating member is large enough to overcome the spring tensile force, the outer end of the braking lever rotates downwards to drive the inner end of the braking lever to move upwards accordingly and finally enable the braking block to press against the lower surface of the cable. Therefore, the cable is sandwiched between the wheel running on the cable and the braking block below the cable, thus enabling a braking operation by means of the friction force of the cable with the wheel above it and the braking block below it. When the braking operation is completed, the manipulating member may be deactivated and released. The downward pulling force to the outer end of the braking lever originally applied by the manipulating member disappears. Thus, the outer end of the braking lever can rotate in an opposite direction (i.e. rotating upwards), due to the spring tensile force, back to its normal position inclined upwards, thus driving the inner end of the braking lever to accordingly rotate in an opposite direction (i.e. rotating downwards) back to its normal position inclined downwards and detached from the cable.

It should be noted that the "inner end" and "outer end" of the braking lever as used herein are not limited to a mathematical or geometrical concept, such an inner end point and an outer end point; instead, they refer to a practical concept, i.e. a portion located at the inner end or the outer end and having a certain size or occupying a certain region. Therefore, in practical use, the "inner end" and "outer end" may have a structure with more specific details. In an embodiment, the "inner end" or "outer end" may correspond to a portion with a largest dimension of 0.5-2.5 cm, such as a circular shaped portion with a diameter of 0.5-2.5 cm, depending on the specific application.

Preferably, in any of the embodiments of the present invention, the braking block has a braking face for pressing against the lower surface of the cable and the braking face has a recessed shape corresponding to the contour of the cable.

Therefore, the braking face of the braking block can better match the lower surface of the cable in shape. Thus, when the braking block presses against the lower surface of the cable, a larger contact area therebetween is obtained to provide a higher friction force for more reliable braking.

It should be noted that the "match . . . in shape" as used herein should be understood in a broad sense. That is, the curvature radius of the braking face may be equal to the curvature radius of the cable contour, or may be larger than the curvature radius of the cable contour, as long as the braking block can match and cooperate with the cable well when contacting with the lower surface of the cable. In an embodiment, the curvature radius of the braking face may be as large as 105%-600% of the curvature radius of the cable contour, or may be even larger. In a simplified embodiment, the curvature radius of the braking face may be even an infinite value, that is, the braking face has a shape of flat plane.

In an embodiment, the braking block has a curved plate shape on the whole, that is, it has a concave braking face towards the cable.

In another embodiment, the braking block may have any shape on the whole, such as a rectangular shape for example. In this case, the braking block has a concave braking face towards the cable.

Preferably, in any of the embodiments of the present invention, the braking block has a braking face for pressing against the lower surface of the cable and the braking face has a groove extending along the extension direction of the cable.

Therefore, the braking face of the braking block can better match the lower surface of the cable in shape. Thus, when the braking block presses against the lower surface of the cable, the cable can be received in the groove of the braking face. Thus, on one hand, the cable can be better positioned with respect to the braking face, and on the other hand, a larger contact area therebetween is obtained to provide a higher friction force for more reliable braking.

It should be understood that the groove in the braking face should match the cable contour in shape for receiving the cable therein. Likely, the "match . . . in shape" as used herein should be understood in a broad sense. That is, the curvature radius of the braking face may be equal to the curvature radius of the cable contour, or may be larger than the curvature radius of the cable contour, as long as the braking block can match and cooperate with the cable well when contacting with the lower surface of the cable. In an embodiment, the curvature radius of the braking face may be as large as 105%-600% of the curvature radius of the cable contour, or may be even larger.

In an embodiment, optionally, the running mechanism may comprises a wheel motor with its output end connected via a wheel transmission structure (preferably including a bevel gear, for example) to a rotation shaft of the front wheel and/of the rear wheel; and a cam motor with its output end connected via a cam transmission structure (preferably including a bevel gear, for example) to a rotation shaft of the cam.

The transmission by means of the bevel gear can enable automatic locking and stopping without any sliding such that the power transmission can be more stable and reliable.

In an embodiment, optionally, the front wheel and/or rear wheel may be made of electrically insulating materials, or may comprise an external electrically insulating layer.

Preferably, in any of the embodiments of the present invention, the multiple divided cables are four divided cables, or three divided cables, or two divided cables.

In the high-voltage power transmission lines, the power transmission loss may be reduced by using the multiple divided cables in which the electric power is transmitted, such as four divided cables, or three divided cables, or two divided cables.

In an embodiment, optionally, the electric vehicle may be used for routing inspection along the two divided cables of 220V power transmission lines.

In another embodiment, optionally, the electric vehicle may be used for routing inspection along the four divided cables of 500V power transmission lines. Preferably, in this case, the two running mechanisms are running on two parallel upper cables (same or different in elevation/height), respectively, of the four divided cables.

In an embodiment, optionally, the two running mechanisms are running on two parallel upper cables (same or different in elevation/height), respectively, of the four divided cables, and a protection structure, such as a protection bar or a protection rope for example, may be provided between a rim of the hanging seat and the cable(s) (such as the upper cables or the lower cables) of the four divided cables. Therefore, when the vehicle body is damaged or broken, the protection structure can provide additional safety protection for the operator(s) in the hanging seat. The protection structure in an embodiment may be connected to the cable by a connecting ring through which the cable can pass to avoid interference to the running of the electric vehicle. Preferably, the connecting ring is detachable from the cable.

In an embodiment, optionally, the electric vehicle may comprise a safety rope with its lower end drooping down to the hanging seat such that the operator may attach himself/herself to the safety rope during running of the electric vehicle for improving operation safety. The upper end of the safety rope may be fixed to the running mechanism (such as the cross beam thereof for example) or to the vehicle body of the electric vehicle.

Optionally, in any embodiment of the present invention, the cam may be replaced by a circular eccentric wheel. By configuring the size and the rotation center of the circular eccentric wheel according to the practical requirements, the same/similar function to the cam can be achieved for assisting obstacle crossing.

FIG. 1 is a structural diagram of a running mechanism of an electric vehicle for routing inspection of power transmission lines according to an embodiment of the present invention, wherein a normal running state is shown.

Figure 2:
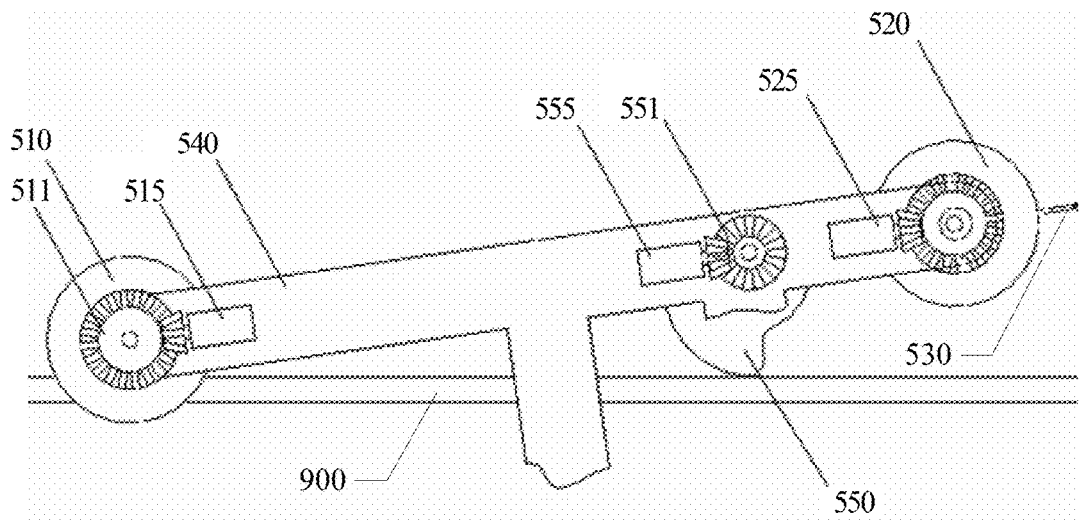
FIG. 2 is a structural diagram of a running mechanism of an electric vehicle for routing inspection of power transmission lines according to an embodiment of the present invention, wherein an obstacle crossing state is shown.

FIG. 2 is a structural diagram of a running mechanism of an electric vehicle for routing inspection of power transmission lines according to an embodiment of the present invention, wherein an obstacle crossing state is shown.

As shown in the embodiments in FIGS. 1 and 2, the running mechanism comprises:

a front wheel 520 (a respective driving motor 525 is also shown in the figure) and a rear wheel 510 (a respective driving motor 515 and a respective rotation shaft 511 are also shown in the figure) connected by a cross beam 540 and rolling on the cable 900, the front and rear wheels each having an annular groove on its circumferential rim for receiving the cable therein;

the cross beam 540 connected between the front wheel 520 and the rear wheel 510;

an obstacle sensor 530 directing forward (directing to the right in the figure) with respect to the front wheel 520 (in an embodiment, the obstacle sensor may be disposed on the front wheel 520 or its support structure); and a cam 550 rotatably mounted to the cross beam 540 (a respective driving motor 555 and a respective rotation shaft 551 are also shown in the figure), the cam 550 rotating to roll onto the cable after an obstacle is detected on the cable within an effective range in front (on the right in the figure) of the front wheel by the obstacle sensor 530, to support a front portion (the right portion in the figure) of the cross beam 540 upwards such that the front wheel 520 is raised to a position above the cable (as shown in FIG. 2, for example), and the cam 550 continuing rolling on the cable after the front wheel passes the obstacle such that the front portion of the cross beam 540 falls back downwards and the front wheel 520 then falls back onto the cable (as shown in FIG. 1, for example)

Figure 3:
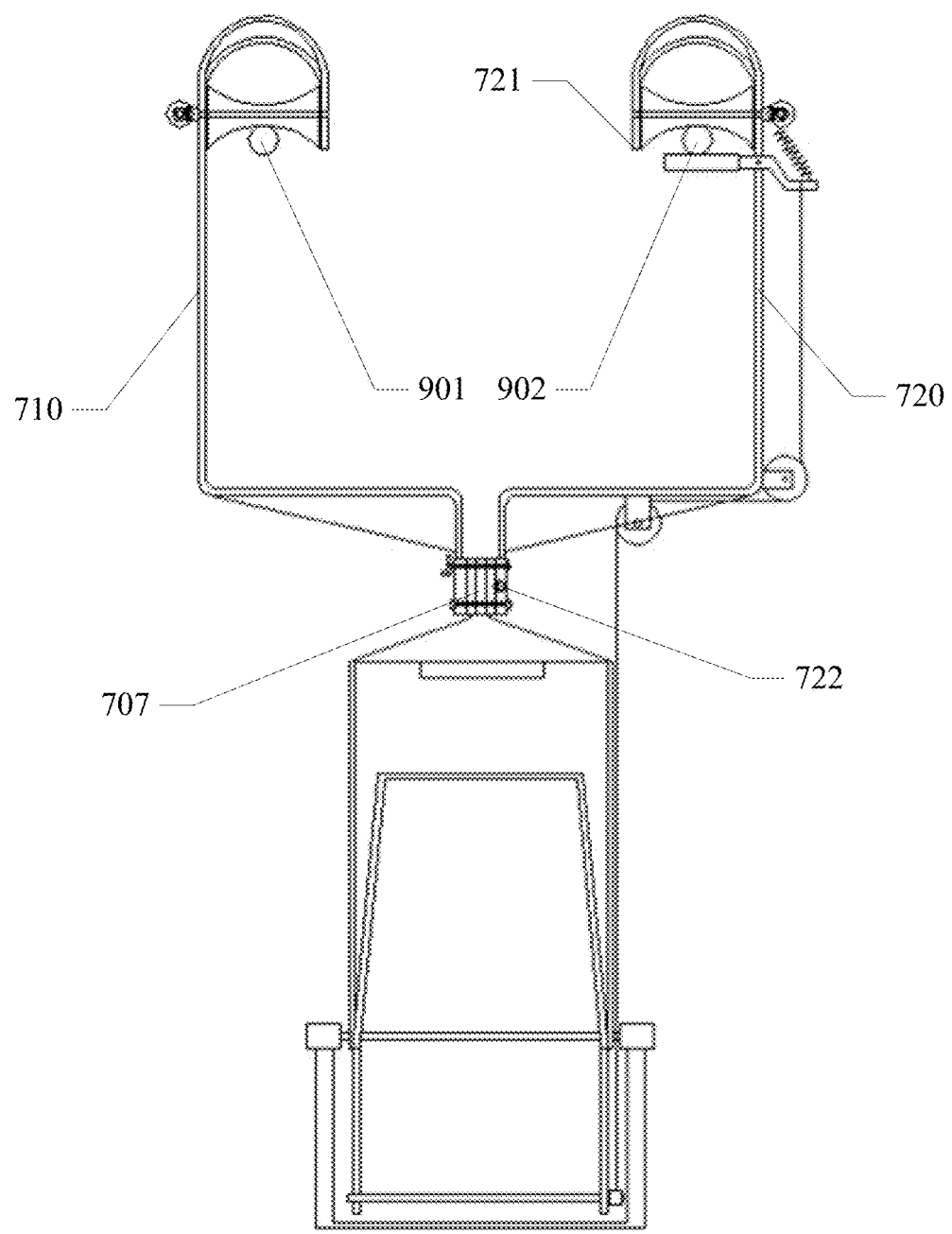
FIG. 3 is a structural diagram of an electric vehicle for routing inspection of power transmission lines, after it is mounted to the cable, according to an embodiment of the present invention.

FIG. 3 is a structural diagram of an electric vehicle for routing inspection of power transmission lines, after it is mounted to the cable, according to an embodiment of the present invention.

Figure 4:
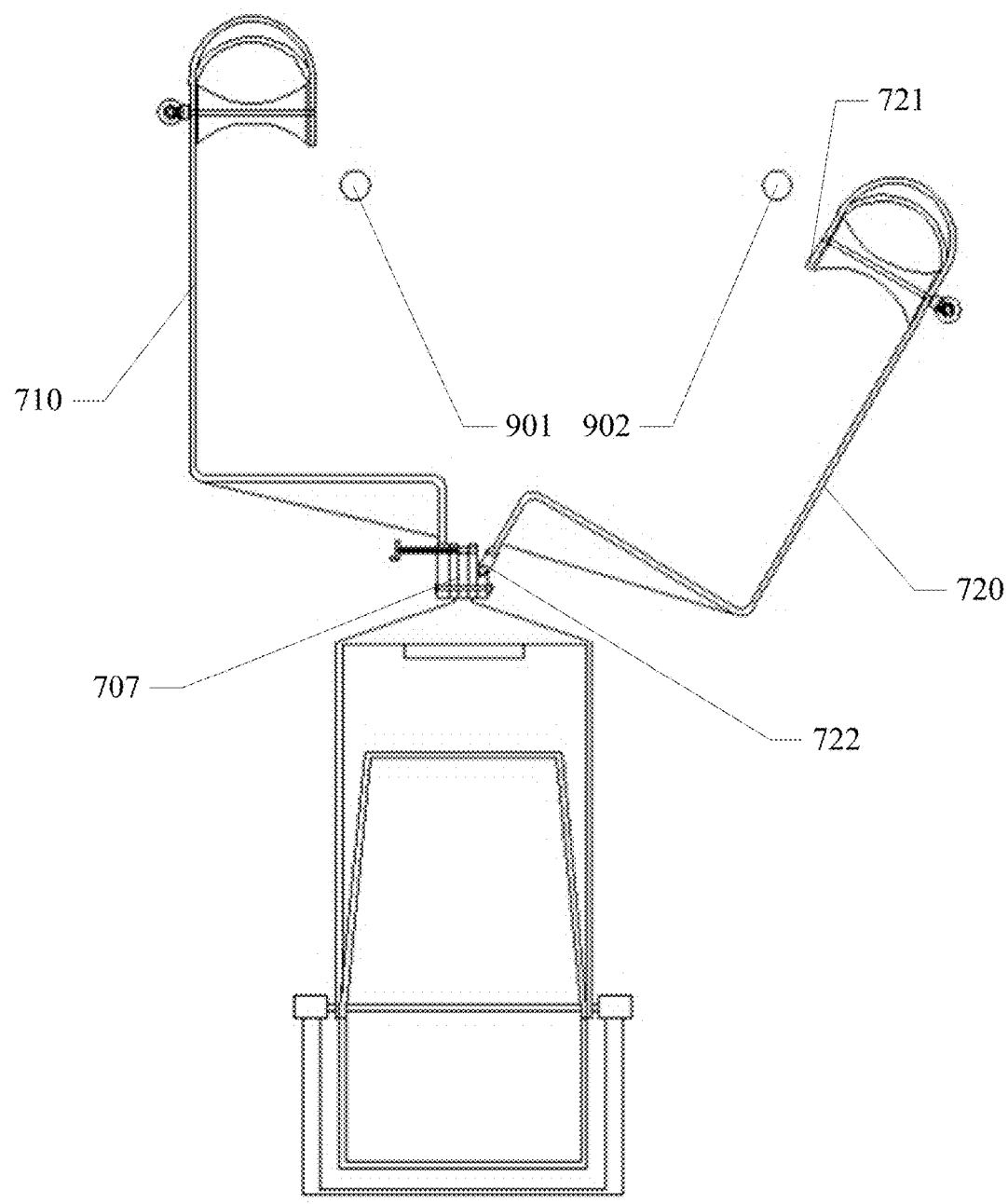
FIG. 4 is a structural diagram of an electric vehicle for routing inspection of power transmission lines, before it is mounted to the cable, according to an embodiment of the present invention.

FIG. 4 is a structural diagram of an electric vehicle for routing inspection of power transmission lines, before it is mounted to the cable, according to an embodiment of the present invention.

As shown in the embodiments in FIGS. 3 and 4, the electric vehicle is mounted onto the cable by two hanging arms, wherein:

each of the hanging arms 710, 720 has a lower end mounted to the body and an upper end extending upwards to above the cable(s) 901, 902 for mounting the running mechanism, at least one of the hanging arms is movable (such as the hanging arm 720 shown in FIG. 2), with its lower end 722 rotatably mounted to the body such that the two hanging arms can rotate with respect to each other to be in a close state or an open state, wherein in the close state, the front and rear wheels of the two running mechanisms are mounted and positioned on the two parallel cables by the upper ends 721 of the hanging arms, and optionally the two hanging arms may be locked with respect to each other by the locking means.

Figure 5:
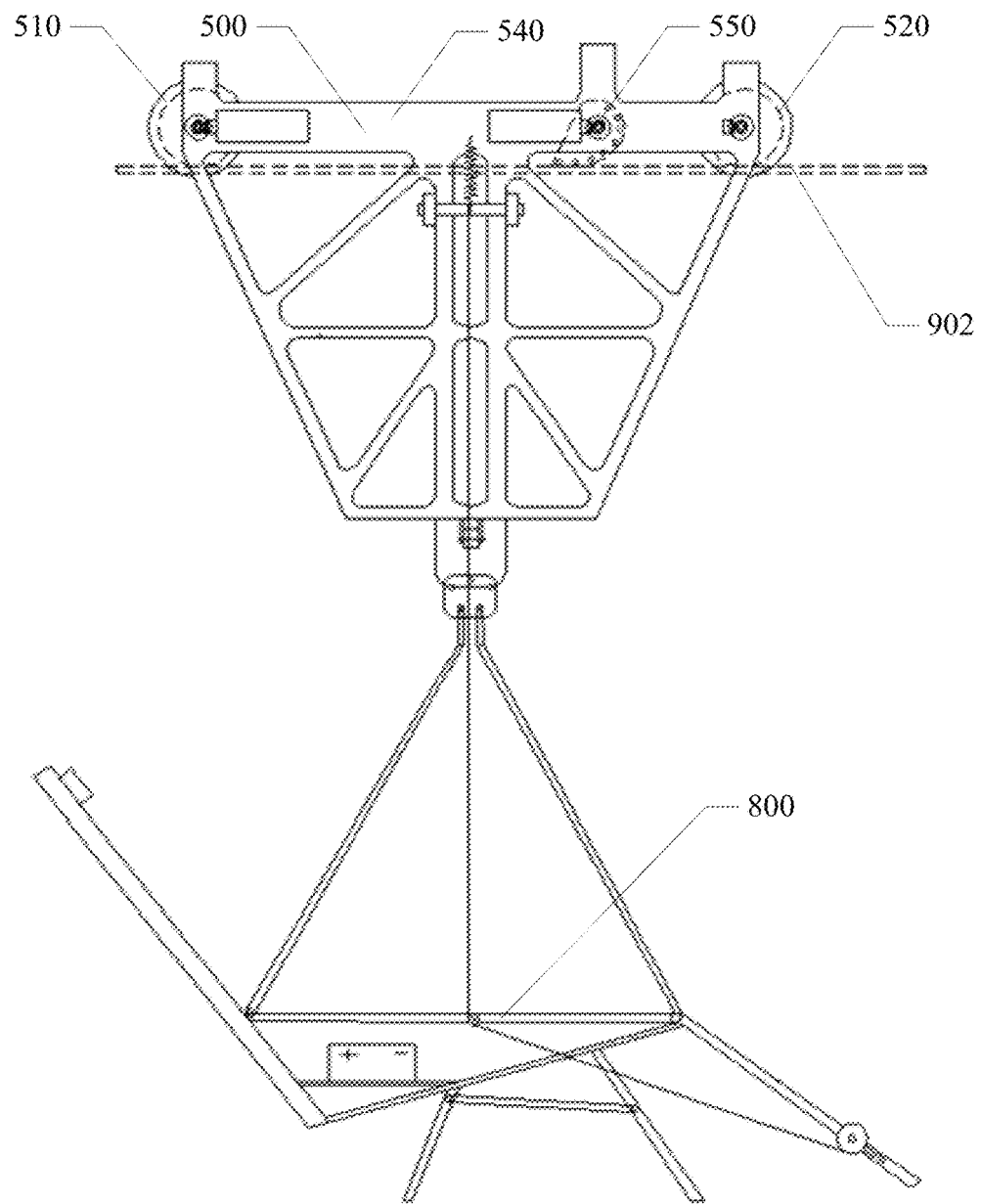
FIG. 5 is a side view of an electric vehicle for routing inspection of power transmission lines according to an embodiment of the present invention.

FIG. 5 is a side view of an electric vehicle for routing inspection of power transmission lines according to an embodiment of the present invention.

As shown in the embodiment in FIG. 5, an electric vehicle for routing inspection of power transmission lines is provided, used for routing inspection along multiple divided cables of high-voltage power transmission lines, comprising:

a body;

a running mechanism 500 mounted to the body, comprising a front wheel 520 and a rear wheel 510 connected by a cross beam 540 and rolling on the cable 920 (indicated by horizontal dashed lines in the figure), the front and rear wheels 520, 510 each having an annular groove on its circumferential rim for receiving the cable therein; an obstacle sensor (not shown) directing forward (directing to the right in the figure) with respect to the front wheel 520; and a cam 550 rotatably mounted to the cross beam 540, the cam 550 rotating to roll onto the cable after an obstacle is detected on the cable within an effective range in front (on the right in the figure) of the front wheel by the obstacle sensor, to support a front portion (the right portion in the figure) of the cross beam 540 upwards such that the front wheel 520 is raised to a position above the cable (as shown in FIG. 2, for example), and the cam 550 continuing rolling on the cable after the front wheel passes the obstacle such that the front portion of the cross beam falls back downwards and the front wheel then falls back onto the cable (as shown in FIGS. 1 and 5, for example), wherein two of the running mechanisms are running on two parallel cables, respectively;

a hanging seat 800 rotatably hanging to the body, below the running mechanisms 500; and a control device at least partially disposed in the hanging seat 800 and comprising a braking device, the braking device having a braking block able to detachably press against a lower surface of the cable and/or the front wheel and/or the rear wheel.

Though the embodiment in FIG. 5 shows that the hanging seat 800 has a form of sitting chair, the hanging seat in other embodiments may, according to the specific requirements, have other structures, such as a hanging basket structure for example.

For operations of routing inspection and maintenance for power transmission lines, the prior technical problems (such as those related to manual running and other operations along the power transmission lines for routing inspection and maintenance for example), can be solved by the embodiment(s) of the present invention wherein a battery or accumulator may be provided as the power supply. The electric vehicle for routing inspection of power transmission lines according to the embodiment(s) of the present invention is high in both running and operation efficiencies, suitable for long span running along the power transmission lines, and able to cross the obstacle(s) along the cable.

Therefore, the electric vehicle for routing inspection of power transmission lines according to the embodiment(s) of the present invention enables safer and more effective routing inspection and maintenance for power transmission lines.

It should be noted that the plurality of elements/features connected by the expression of "and/or" in the description herein refer to one or more of these elements/features. For example, the clause of "the first feature and/or the second feature" means one or more of the first and second features, including three cases: only the first feature, or only the second feature, or both the first and second features.

The various embodiments in the present invention can be combined with one another as needed, to form the new embodiment(s) of the present invention. For example, the features (all features or some features) from any two or three or more embodiments can be combined to form a new embodiment of the present invention. All these embodiments are within the protection scope of the present invention, unless it is defined otherwise or is technically contradictory for implementation.

It should be understood by those skilled in the art that the specific embodiments of the present invention described herein are for illustration only, not for limiting the protection scope of the present invention. Any change, variation or equivalent alternative made to the described embodiments based on the spirit and principles of the present invention will fall within the protection scope of the present invention.

The invention claimed is:

1. An electric vehicle for routing inspection of power transmission lines, used for routing inspection along multiple divided cables of high-voltage power transmission lines comprising:
   a body;
   a running mechanism mounted to the body, comprising a front wheel and a rear wheel connected by a cross beam and rolling on the cable, the front and rear wheels each having an annular groove on its circumferential rim for receiving the cable therein; an obstacle sensor directing forward with respect to the front wheel; and a cam rotatably mounted to the cross beam, the cam rotating to roll onto the cable after an obstacle is detected on the cable within an effective range in front of the front wheel by the obstacle sensor, to support a front portion of the cross beam upwards such that the front wheel is raised to a position above the cable, and the cam continuing rolling on the cable after the front wheel passes the obstacle such that the front portion of the cross beam falls back downwards and the front wheel then falls back onto the cable, wherein two of the running mechanisms are running on two parallel cables, respectively;
   a hanging seat rotatably hanging to the body, below the running mechanisms; and
   a control device at least partially disposed in the hanging seat and comprising a braking device, the braking device having a braking block able to detachably press against a lower surface of the cable and/or the front wheel and/or the rear wheel;
   wherein each of the two running mechanisms is mounted to the body by a respective hanging arm; and
   each hanging arm has a lower end mounted to the body and an upper end above the cable for mounting the running mechanism, at least one of the hanging arms is movable, with its lower end rotatably mounted to the body such that the two hanging arms can rotate with respect to each other to be in a close state or an open state, wherein in the close state, the front and rear wheels of the two running mechanisms are mounted and positioned on the cables; and
   wherein at least one of the two hanging arms has a telescopic portion in the direction of the length such that the upper end of the hanging arm has an adjustable elevation.

2. The electric vehicle for routing inspection of power transmission lines according to claim 1, wherein
   the upper end of one of the hanging arms bends towards the other hanging arm and then bends back downwards to form an "n" shaped structure for enclosing the front wheel or rear wheel, wherein the "n" shaped structure has an opening which is opened downwards; and
   the hanging arm is provided with a closing structure at the opening of the "n" shaped structure for at least partially closing the opening.

3. The electric vehicle for routing inspection of power transmission lines according to claim 1, wherein the braking device comprises:
   a braking lever comprising a pivot connection rotatably mounted to the body, as well as an inner end and an outer end positioned at opposite sides of the pivot connection;
   a braking block mounted on the inner end of the braking lever and positioned below a portion of the cable where the front wheel or rear wheel is positioned;
   a manipulating member connected to the outer end of the braking lever;
   a spring connected between the braking lever and the body, with a connection point of the spring to the braking lever being apart from the pivot connection of the braking lever;
   wherein when the manipulating member is activated, the outer end of the braking lever is rotated downwards and the braking block on the inner end of the braking lever is driven to move upwards to press against the lower surface of the cable for braking operation; and wherein when the manipulating member is deactivated, the braking lever is rotated in an opposite direction due to a restoring force of the spring such that the braking block is detached from the cable.

4. The electric vehicle for routing inspection of power transmission lines according to claim 1, wherein
   the braking block has a braking face for pressing against the lower surface of the cable and the braking face has a recessed shape corresponding to the contour of the cable;
   or
   the braking block has a braking face for pressing against the lower surface of the cable and the braking face has a groove extending along the extension direction of the cable.

5. The electric vehicle for routing inspection of power transmission lines according to claim 1, wherein
   the obstacle sensor comprises a tactile sensor or an optical sensor.

6. The electric vehicle for routing inspection of power transmission lines according to claim 5, wherein
   the tactile sensor comprises a telescopic probe directing forward with respect to the front wheel and the probe can retract when contacting an obstacle in front of it.

7. The electric vehicle for routing inspection of power transmission lines according to claim 1, wherein
   the cam is provided on its circumferential rim with a plurality of mini-wheels whose rotation axes are parallel to a rotation axis of the cam, and each mini-wheel is radially recessed on its circumferential rim.

8. The electric vehicle for routing inspection of power transmission lines according to claim 1, wherein
   the multiple divided cables are four divided cables, or three divided cables, or two divided cables.

* * * * *